United States Patent
Imai

(10) Patent No.: US 6,724,227 B2
(45) Date of Patent: Apr. 20, 2004

(54) LOAD-DRIVING SEMICONDUCTOR DEVICE

(75) Inventor: Hiroshi Imai, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/383,084

(22) Filed: Mar. 6, 2003

(65) Prior Publication Data

US 2003/0197543 A1 Oct. 23, 2003

(30) Foreign Application Priority Data

Apr. 19, 2002  (JP) .......................................... 2002-117161

(51) Int. Cl.$^7$ ................................................. H03B 1/00
(52) U.S. Cl. ........................ 327/108; 327/109; 327/434; 327/390
(58) Field of Search ................................. 327/108, 109, 327/143, 544, 546, 427, 432–434, 581, 478, 490, 390, 333; 326/81, 82, 88, 92

(56) References Cited

U.S. PATENT DOCUMENTS

| | | | |
|---|---|---|---|
| 5,914,619 A | * | 6/1999 | Tihanyi ....................... 327/109 |
| 6,285,222 B1 | | 9/2001 | Kitade ......................... 327/143 |
| 6,545,513 B2 | * | 4/2003 | Tsuchida et al. ............. 327/108 |
| 6,603,341 B2 | * | 8/2003 | Tuchiya et al. .............. 327/390 |
| 2001/0010477 A1 | | 8/2001 | Myono ........................ 327/536 |

FOREIGN PATENT DOCUMENTS

| | | |
|---|---|---|
| JP | 2000-36732 | 2/2000 |
| JP | 2001-286125 | 10/2001 |

* cited by examiner

*Primary Examiner*—Long Nguyen
(74) *Attorney, Agent, or Firm*—Harness, Dickey & Pierce, PLC

(57) ABSTRACT

In a composite IC in which integrated are a power transistor, a bipolar analog circuit and a MOS logic circuit, a load-driving semiconductor device is provided which is capable of certainly placing the power transistor into an off-condition at power-on for stopping the driving of a load. In the semiconductor device, a high-side switch MOS transistor, a charge pump, a bipolar analog circuit, a charge pump driving CMOS logic circuit, a level conversion CMOS logic circuit and a forcibly stopping bipolar transistor 90 are made in the form of an IC, and the forcibly stopping bipolar transistor receives, through its base terminal, a signal which inverts when a drive voltage exceeds a predetermined value to turn to an on-condition. This operation places the bipolar analog circuit into a driving-stopped condition.

12 Claims, 4 Drawing Sheets

LOAD-DRIVING SEMICONDUCTOR DEVICE

BACKGROUND OF THE INVENTION

1) Field of the Invention

The present invention relates to a semiconductor device for driving a load.

2) Description of the Related Art

FIG. 1 is an illustration of one example of a load-driving circuit, where a power transistor (N-channel MOS) 3 and a load 2 are connected through a switch SW1 to a power supply 1. Concretely, the power transistor 3 is connected thereto to be placed on the power supply side with respect to the load 2 between the power supply 1 and the ground, with the power transistor 3 being used as a high-side switch. The load-driving circuit, including this power transistor 3, is made in the form of a composite IC, and on one chip are integrated the power transistor 3, a gate driving circuit 4, a clock generating circuit 5, a signal processing logic circuit 8, a constant-voltage circuit 6 and a power-on reset circuit 7. Moreover, in the gate driving circuit 4 are integrated a bipolar analog circuit and a CMOS logic circuit. Still moreover, data are interchanged between a microcomputer 10 and the signal processing logic circuit 8, and a drive signal is supplied from the signal processing logic circuit 8 to the gate driving circuit 4 to turn on the power transistor 3 for energizing the load 2. On the other hand, a signal (power-on reset signal) from the power-on reset circuit 7 can stop the signal processing logic circuit 8 at power-on (the start of the power supply).

Meanwhile, in the case of the arrangement of such a composite IC, although the power-on reset circuit 7 can certainly stop the signal processing logic circuit 8 at the power-on, there is a possibility that, because the CMOS logic circuit and the bipolar analog circuit exist in a state mixed with each other in the gate driving circuit 4, the drive stop thereof becomes difficult. In detail, the bipolar analog circuit (bipolar transistor) is put to use due to the power supply withstand voltage limitation, and a level conversion MOS logic circuit becomes necessary to drive the bipolar transistor through the use of a drive circuit (digital signal). In the case of the employment of this MOS logic circuit, at power-on, the transistor of the bipolar analog circuit operates before the level conversion MOS logic circuit functions, so the power MOS transistor 3 falls into a half-on condition to make a current flow through the load 2.

SUMMARY OF THE INVENTION

The present invention has been developed in consideration of the above-mentioned situations, and it is therefore an object of the invention to provide, in a composite IC made by integrating a power transistor, a bipolar analog circuit and a MOS logic circuit, a load-driving semiconductor device capable of certainly bringing the power transistor into an off-condition in response to power-on to stop the driving of a load.

For this purpose, in accordance with the present invention, in a level conversion MOS logic circuit, a level of a drive signal is converted into a predetermined electric potential and outputted as a drive signal for a bipolar analog circuit. This signal adjusts an electric potential at a control terminal of a power transistor in the bipolar analog circuit and turns on the power transistor to energize a load.

Although the drive signal is fed through the level conversion MOS logic circuit to the bipolar analog circuit to turn on the power transistor, in a case in which, at power-on, a transistor of the bipolar analog circuit operates before the level conversion MOS logic circuit functions, the electric potential at the control terminal of the power transistor rises when the drive signal is in an non-outputted condition, so that the power transistor tends to fall into a half-on condition.

On the other hand, according to the present invention, the forcibly stopping bipolar transistor is, at its base terminal, responsive to a signal which inverts when a drive voltage exceeds a predetermined value in accordance with the power-on to take an on-condition for stopping the driving of the bipolar analog circuit. This avoids the rise of the electric potential at the control terminal of the power transistor to maintain the power transistor in an off-condition.

Thus, in the composite IC comprising an integration of the power transistor, the bipolar analog circuit and the MOS logic circuit, the power transistor can certainly be set in an off-condition at the power-on to stop the driving of the load.

In addition, according to the present invention, in the level conversion MOS logic circuit, the level of the drive signal is converted into a predetermined electric potential and outputted as a drive signal for the bipolar analog circuit. This signal controls the power supply to a charge pump in the bipolar analog circuit. On the other hand, on the basis of the drive signal, a charge pump driving MOS logic circuit makes the charge pump conduct a boosting operation. The charge pump is operated in this way to adjust the electric potential at the control terminal of the power transistor and turn on the power transistor for energizing the load.

Although the drive signal is fed through the level conversion MOS logic circuit to the bipolar analog circuit to turn on the power transistor, in a case in which, at power-on, a transistor of the bipolar analog circuit operates before the level conversion MOS logic circuit functions, the electric potential at the control terminal of the power transistor rises when the drive signal is in an non-outputted condition, so that the power transistor tends to fall into a half-on condition.

On the other hand, according to the present invention, the forcibly stopping bipolar transistor is, at its base terminal, responsive to a signal which inverts when a drive voltage exceeds a predetermined value in accordance with the power-on to take an on-condition for stopping the driving of the bipolar analog circuit. This avoids the rise of the electric potential at the control terminal of the power transistor to maintain the power transistor in an off-condition.

Thus, in the composite IC comprising an integration of the power transistor, the bipolar analog circuit and the MOS logic circuit, the power transistor can certainly be set in an off-condition at the power-on to stop the driving of the load.

In this case, preferably, the power transistor is used as a high-side switch.

Furthermore, it is also appropriate that the level conversion MOS logic circuit comprises a constant-current circuit, a MOS transistor connected in series to the constant-current circuit for outputting, as a drive signal for the bipolar analog circuit, a signal with a predetermined electric potential through on/off operations and an inverter for receiving the drive signal to output it to a gate terminal of the MOS transistor. Since the MOS transistor does not function normally from which the power is brought into the on-condition until it reaches its threshold voltage Vt, a current from the constant-current circuit which functions before the timing of reaching the threshold voltage Vt comes in a base terminal of the bipolar transistor in the bipolar analog circuit so that the voltage at the base terminal of the bipolar transistor in the bipolar analog circuit rises to turn on the bipolar transistor, which increases the gate voltage of the power transistor through the charge pump to make the power transistor fall into a half-on condition. The above-mentioned arrangement according to the present invention can eliminate this problem.

BRIEF DESCRIPTION OF THE DRAWINGS

Other objects and features of the present invention will become more readily apparent from the following detailed description of the preferred embodiments taken in conjunction with the accompanying drawings in which.

DESCRIPTION OF THE PREFERRED EMBODIMENTS

An embodiment of the present invention will be described hereinbelow with reference to the drawings.

Figure 1:
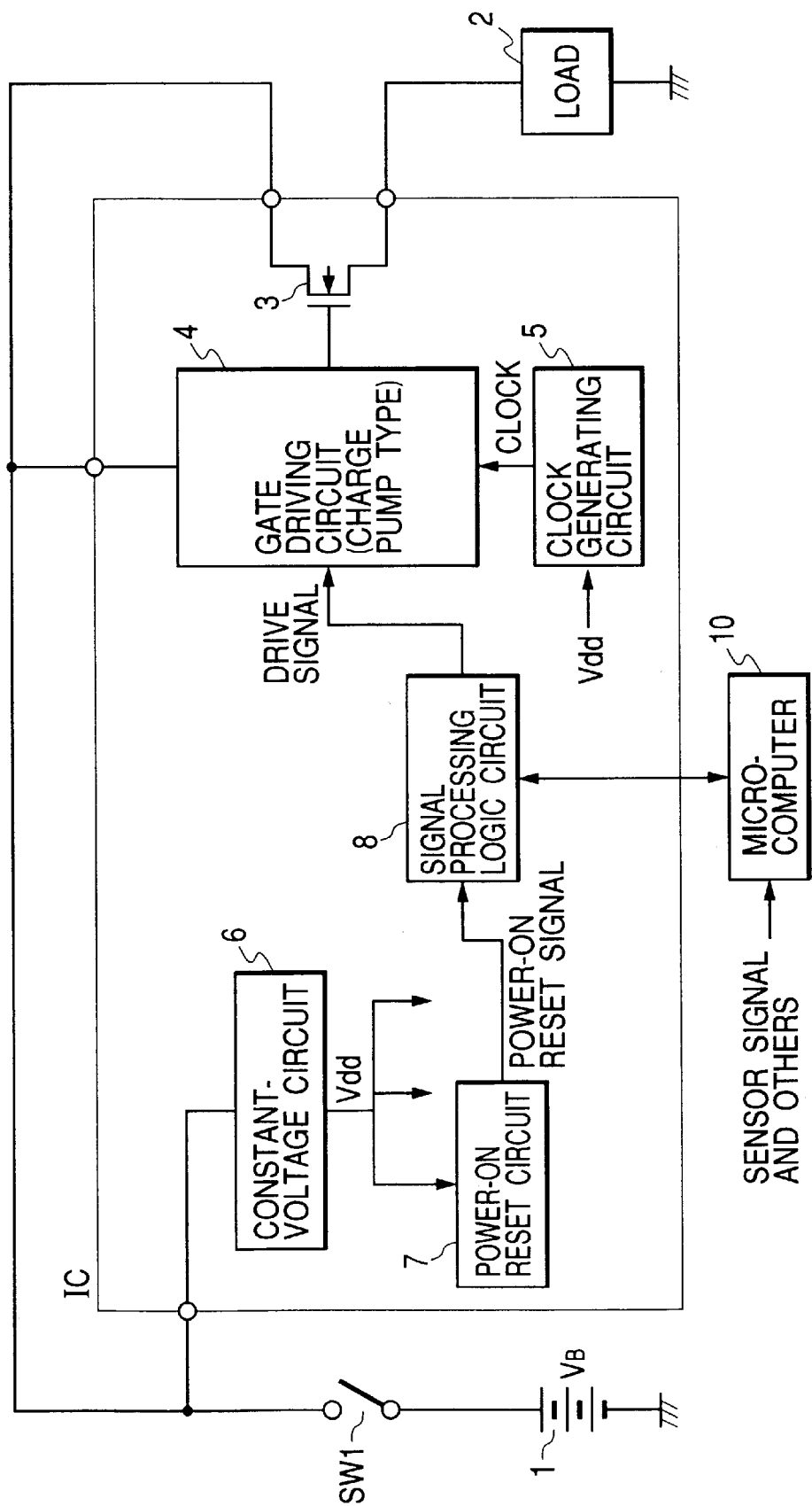
FIG. 1 is an illustration of an arrangement of a load-driving circuit.

Referring to FIG. 1, the entire arrangement of a load-driving circuit (device) according to the embodiment of the invention will be described hereinbelow.

In FIG. 1, the positive terminal of a power supply (battery) 1 is connected through a switch SW1 to the drain terminal of a power MOS transistor (N-channel MOS) 3. The rated voltage VB of the power supply (battery) 1 is set at 14 volts. The source terminal of the power MOS transistor 3 is connected through a load 2 to the ground. In this way, between the power supply 1 and the ground, the power MOS transistor 3 is connected in series to the load 2 to be placed on the power supply side so that the power MOS transistor 3 is used as a high-side switch.

This power MOS transistor 3 and other circuits are made in the form of an composite IC, thus producing a load-driving semiconductor device. In this load-driving semiconductor device (IC), the power MOS transistor 3, a gate driving circuit 4, a clock generating circuit 5, a signal processing logic circuit 8, a constant-voltage circuit 6 and a power-on reset circuit 7 are integrated on the, same chip. The gate driving circuit 4 is connected to the gate terminal of the power MOS transistor 3. The gate driving circuit 4 is connected through the switch SW1 to the positive terminal of the power supply 1. Moreover, the gate driving circuit 4 is connected to the clock generating circuit 5 to receive a clock signal. The constant-voltage circuit 6 is connected through the switch SW1 to the positive terminal of the power supply 1 to be responsive to the supply of the power supply voltage VB from the power supply 1 to generate a drive voltage Vdd and feed it to the respective circuits. More concretely, for the drive voltage Vdd, a 5-V voltage is produced from the 14-V power supply voltage VB and applied to the respective circuits.

In most cases, the drive circuit for the high-side switch power MOS transistor 3 in the composite IC employs CMOS for reasons of easy driving.

Figure 3:
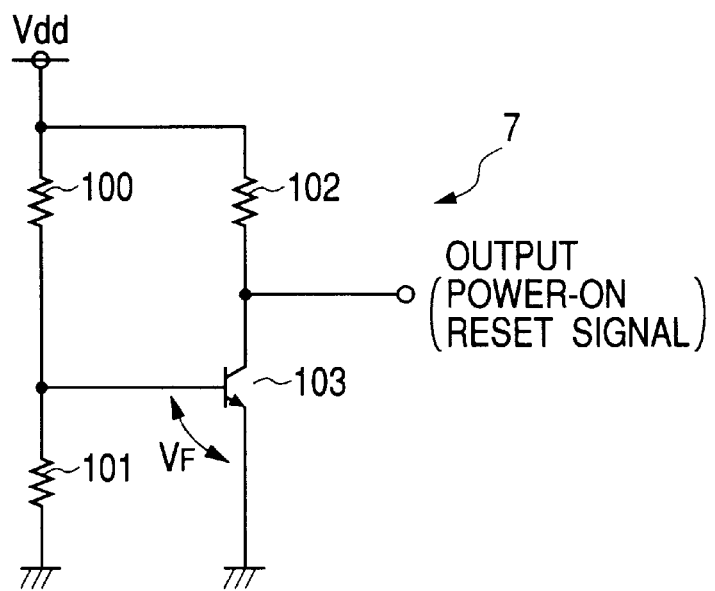
FIG. 3 is an illustration of an arrangement of a power-on reset circuit according to the embodiment.

FIG. 3 shows a concrete arrangement of the power-on reset circuit 7. In FIG. 3, the drive voltage (constant voltage) Vdd is divided by a series circuit comprising resistors 100 and 101 located between the drive voltage input terminal and the ground. Moreover, the drive voltage (constant voltage) Vdd is applied to a series circuit comprising a resistor 102 and a bipolar transistor 103 located between the drive voltage input terminal and the ground. The aforesaid divided voltage is applied to the base terminal of the bipolar transistor 103. Still moreover, when the drive voltage Vdd is at a sufficiently high level, the bipolar transistor 103 takes the on-condition so that the output of the power-on reset circuit 7 goes low in level (L level). On the other hand, if the drive voltage Vdd becomes lower than a predetermined voltage, the bipolar transistor 103 falls into the off-condition to make the output of the power-on reset circuit go high in level (H level). The resetting is conducted at the H level.

Returning again to FIG. 1, a microcomputer 10 is connected to the signal processing logic circuit 8. The microcomputer 10 receives a sensor signal and other signals and interchanges data with the signal processing logic circuit 8. Moreover, the signal processing logic circuit 8 forwards a drive signal to the gate driving circuit 4. This drive signal turns on the power MOS transistor 3 to energize the load 2.

In addition, the signal processing logic circuit 8 is connected to the power-on reset circuit 7 to receive a power-on reset signal (H level), sent from the power-on reset circuit 7, to be placed into a reset condition.

Figure 2:
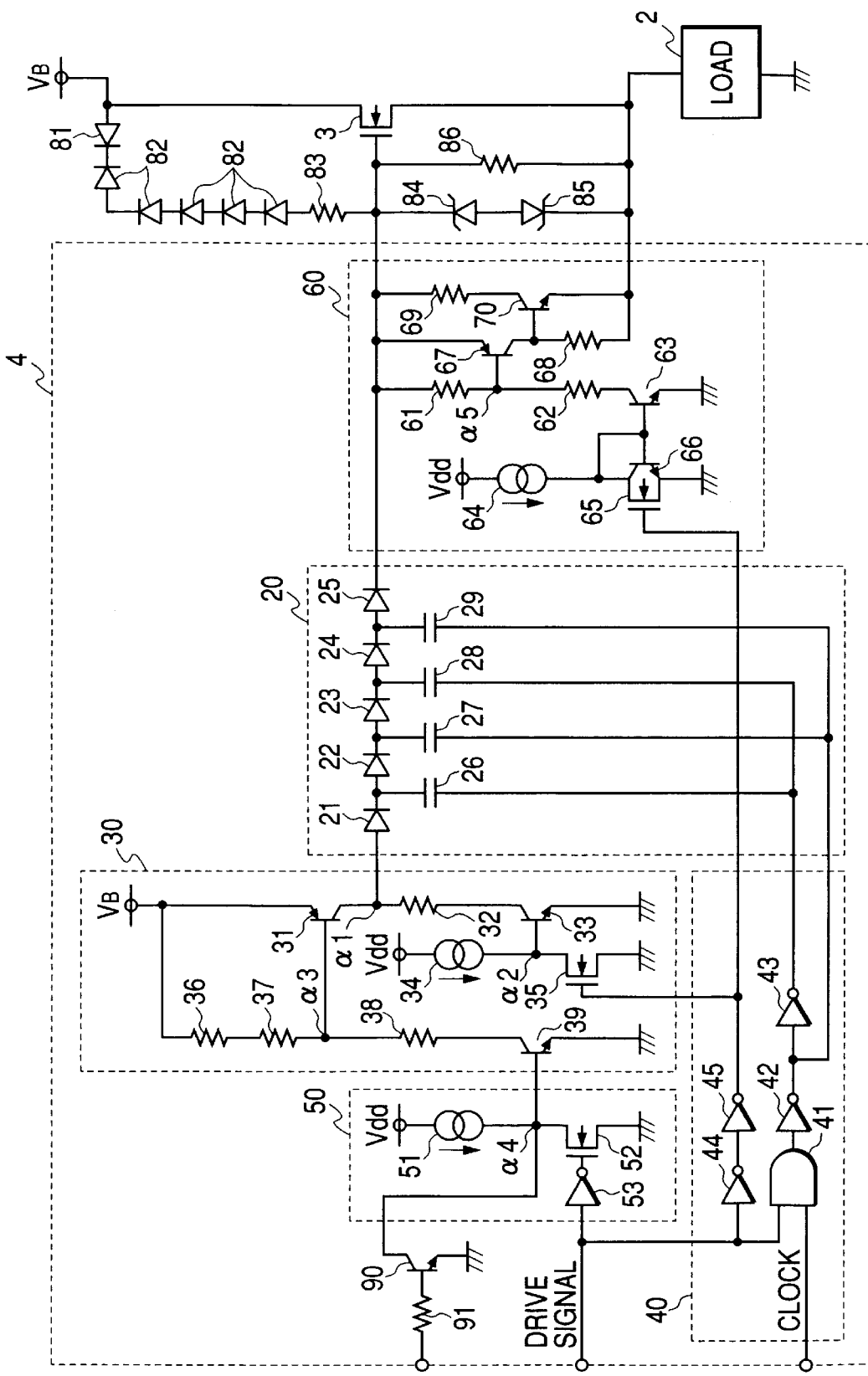
FIG. 2 is an illustration of arrangements of a gate driving circuit and peripheral circuits according to an embodiment of the present invention.

FIG. 2 shows an arrangement of the gate driving circuit 4, shown in FIG. 1, according to this embodiment.

In FIG. 2, the gate driving circuit 4 is equipped with a charge pump 20, a bipolar analog circuit 30, a charge pump driving CMOS logic circuit (in a wide sense, a MOS logic circuit) 40, a level conversion CMOS logic circuit (in a wide sense, a MOS logic circuit) 50 and a gate discharge circuit 60.

In the charge pump 20, diodes 21, 22, 23, 24 and 25 are connected in series to each other, and one end of this series circuit is connected to the gate terminal of the power MOS transistor 3 while the other end thereof is placed on the positive terminal side of the power supply 1. Moreover, one ends of capacitors 26, 27, 28 and 29 are connected between the diodes 21 and 22, between the diodes 22 and 23, between the diodes 23 and 24, and between the diodes 24 and 25, respectively. Thus, the charge pump 20 is connected to the gate terminal (control terminal) of the power MOS transistor 3 for the purpose of adjusting the electric potential at the gate terminal of the power MOS transistor 3.

In the bipolar analog circuit 30, between the power supply (VB) and the ground, a bipolar transistor 31, a resistor 32 and a bipolar transistor 33 are connected in series to each other. A point α1 between the bipolar transistor 31 and the resistor 32 is connected to the aforesaid diode 21. Moreover, between the Vdd terminal and the ground, a constant-current circuit 34 and a MOS transistor 35 are connected in series to each other. A point α2 between the constant-current circuit 34 and MOS transistor 35 is connected to the base terminal of the aforesaid bipolar transistor 33. Still moreover, between the power supply (VB) and the ground, resistors 36, 37 and 38 and a bipolar transistor (NPN transistor) 39 are connected in series to each other. A point α3 between the resistors 37 and 38 is connected to the base terminal of the aforesaid bipolar transistor 31. Thus, the bipolar analog circuit 30 is connected between the power supply (VB) and the gate terminal of the power MOS transistor 3 for the purpose of adjusting the electric potential at the gate terminal of the power MOS transistor 3. In detail, the bipolar analog circuit 30 is connected between the power supply (VB) and the charge pump 20 for controlling the power supply to the charge pump on the basis of a drive signal.

The charge pump driving CMOS logic circuit 40 includes an AND gate 41 and inverters 42 to 45. Moreover, a drive signal is inputted through the inverters 44 and 45 to the gate terminal of the aforesaid MOS transistor 35 and further to the gate terminal of a MOS transistor 65 which will be mentioned later. Still moreover, the drive signal is inputted to one input terminal of the AND gate 41. A clock signal is inputted to the other input terminal of the AND gate 41. The output terminal of the AND gate 41 is connected through the inverter 42 to capacitors 27 and 29. Yet moreover, the output terminal of the AND gate 41 is connected through the inverters 42 and 43 to the capacitors 26 and 28.

Figure 4:
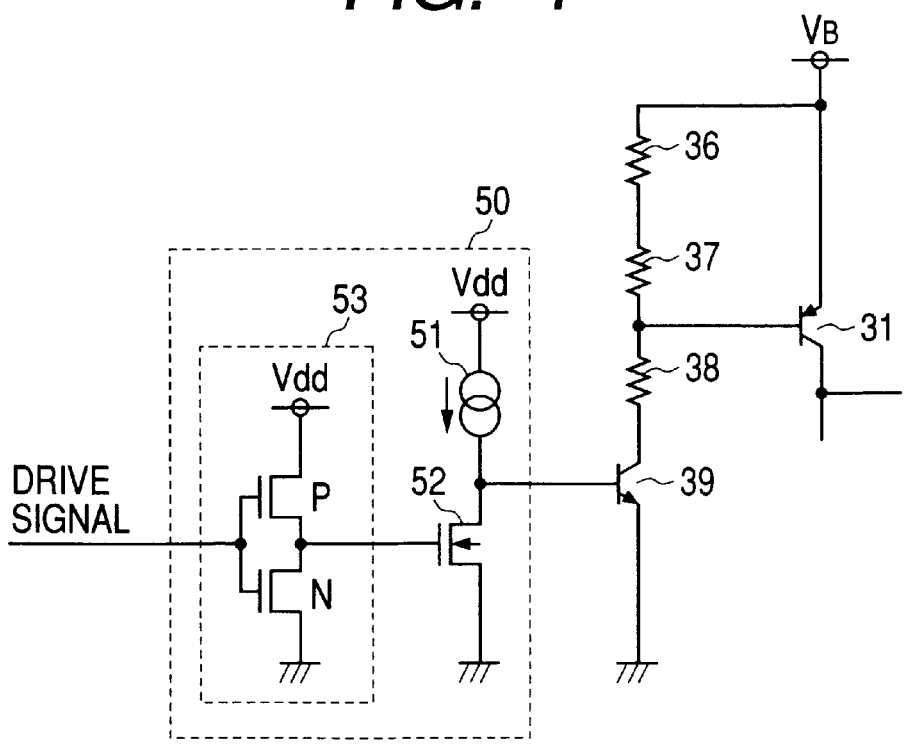
FIG. 4 is an illustration of arrangements of a level conversion MOS logic circuit and peripheral circuits according to the embodiment.

The level conversion CMOS logic circuit 50 includes a constant-current circuit 51, and N-channel MOS transistor 52 and an inverter 53. Between the Vdd terminal and the ground, the constant-current circuit 51 and the N-channel MOS transistor 52 are connected in series to each other. A point α4 between the constant-current circuit 51 and the MOS transistor 52 is connected to the base terminal of the aforesaid bipolar transistor 39. Moreover, the drive signal is inputted through the inverter 53 to the gate terminal of the MOS transistor 52. Still moreover, through the on/off operations of the MOS transistor 52, a signal with a predetermined electric potential is outputted therefrom as a drive signal for the bipolar analog circuit 30. The inverter 53 is a CMOS inverter as shown in FIG. 4, where a PMOS and an NMOS are connected in series to each other between the Vdd terminal and the ground. The inverter 53 receives the drive signal to output a level-inverted signal to the gate terminal of the MOS transistor 52. Thus, the level conversion CMOS logic circuit 50 receives the drive signal to convert its signal level into a predetermined electric potential for outputting it as a drive signal to the bipolar analog circuit 30.

The charge pump driving CMOS logic circuit 40, shown in FIG. 2, makes the charge pump 20 conduct-a boosting operation on the basis of the drive signal to boost the power supply voltage VB=14 volts into 24 volts. In detail, in response to the input of the drive signal (H level signal), the MOS transistor 52 of the level conversion CMOS logic circuit 50 turns to the off-condition, the transistor 39 turns to the on-condition, and the transistor 31 turns to the on-condition. Moreover, on the basis of the input of the drive signal, the transistor 35 of the bipolar analog circuit 30 is placed into the on-condition and the transistor 33 is placed into the off-condition. Accordingly, the power supply voltage VB is applied through the transistor 31 to the charge pump 20. Still moreover, on the basis of the output of the AND gate 41 stemming from the drive signal and the clock signal, it is successively boosted through the capacitors 26, 27, 28 and 29 in a state phase-shifted so that a 24-V voltage acts on the gate terminal of the power MOS transistor 3.

In the gate discharge circuit 60 shown in FIG. 2, between the gate terminal of the power MOS transistor 3 and the ground, resistors 61, 62 and a bipolar transistor 63 are connected in series to each other. Moreover, between the Vdd terminal and the ground, a constant-current circuit 64 and a MOS transistor 65 are connected in series to each other. A bipolar transistor 66 is connected in parallel to the MOS transistor 65. The base terminal of the bipolar transistor 66 is connected to the base terminal of the bipolar transistor 63, and the base terminals of both the transistors 63 and 66 are connected to the collector terminal of the bipolar transistor 66. The transistors 66 and 63 constitute a current mirror circuit. The drive signal is inputted through the aforesaid inverters 44 and 45 to the gate terminal of the MOS transistor 65. Moreover, between the gate and source of the power MOS transistor 3, a bipolar transistor 67 and a resistor 68 are connected in series to each other and a resistor 69 and a bipolar transistor 70 is connected in series to each other, with the base terminal of the bipolar transistor 70 being connected to the collector terminal of the bipolar transistor 67. The base terminal of the bipolar transistor 67 is connected to a point α5 between the resistors 61 and 62.

In addition, upon receipt of the input of the drive signal, the transistor 65 is placed into the on-condition, the transistors 66, 63, 67 and 70 are placed into the off-condition. Moreover, in response to the completion of the input of the drive signal, the transistor 65 turns to the off-condition, the transistors 66 and 63 turn to the on-condition, and the transistors 67 and 70 turn to the on-condition so that the gate charge of the power MOS transistor 3 is discharged early.

As a peripheral arrangement with respect to the power MOS transistor 3 shown in FIG. 2, between the drain and gate of the power MOS transistor 3, diodes 81, 82 and a resistor 83 are connected in series to each other, thereby protecting from surge. In detail, when a surge voltage is applied to the drain terminal (power supply side) of the power MOS transistor 3, the gate electric potential of the power MOS transistor 3 rises to cause the power MOS transistor 3 to fall into the on-condition so that the surge current flows through the power MOS transistor 3 to the ground side, which results in protecting the power MOS transistor 3.

In addition, between the gate and source of the power MOS transistor 3, diodes 84 and 85 are connected in series to each other, which provides a function as a clamping circuit for producing a constant voltage. A resistor 86 is connected between the gate and source of the power MOS transistor 3, which contributes to the voltage discharge in the off-condition of the transistor 3.

Still additionally, the base terminal of the bipolar transistor 39 of the aforesaid bipolar analog circuit 30 is connected through a bipolar transistor (NPN transistor) 90 to the ground. The base terminal of the bipolar transistor 90 is connected through a resistor 91 to the power-on reset circuit 7 (see FIG. 1). Moreover, to the base terminal of the bipolar transistor 90, the power-on reset signal is inputted as a signal which inverts when the drive voltage Vdd exceeds a predetermined value in response to the power-on.

Secondly, a description will be given hereinbelow of an operation of the load driving circuit (load-driving semiconductor device) thus constructed.

Figure 5:
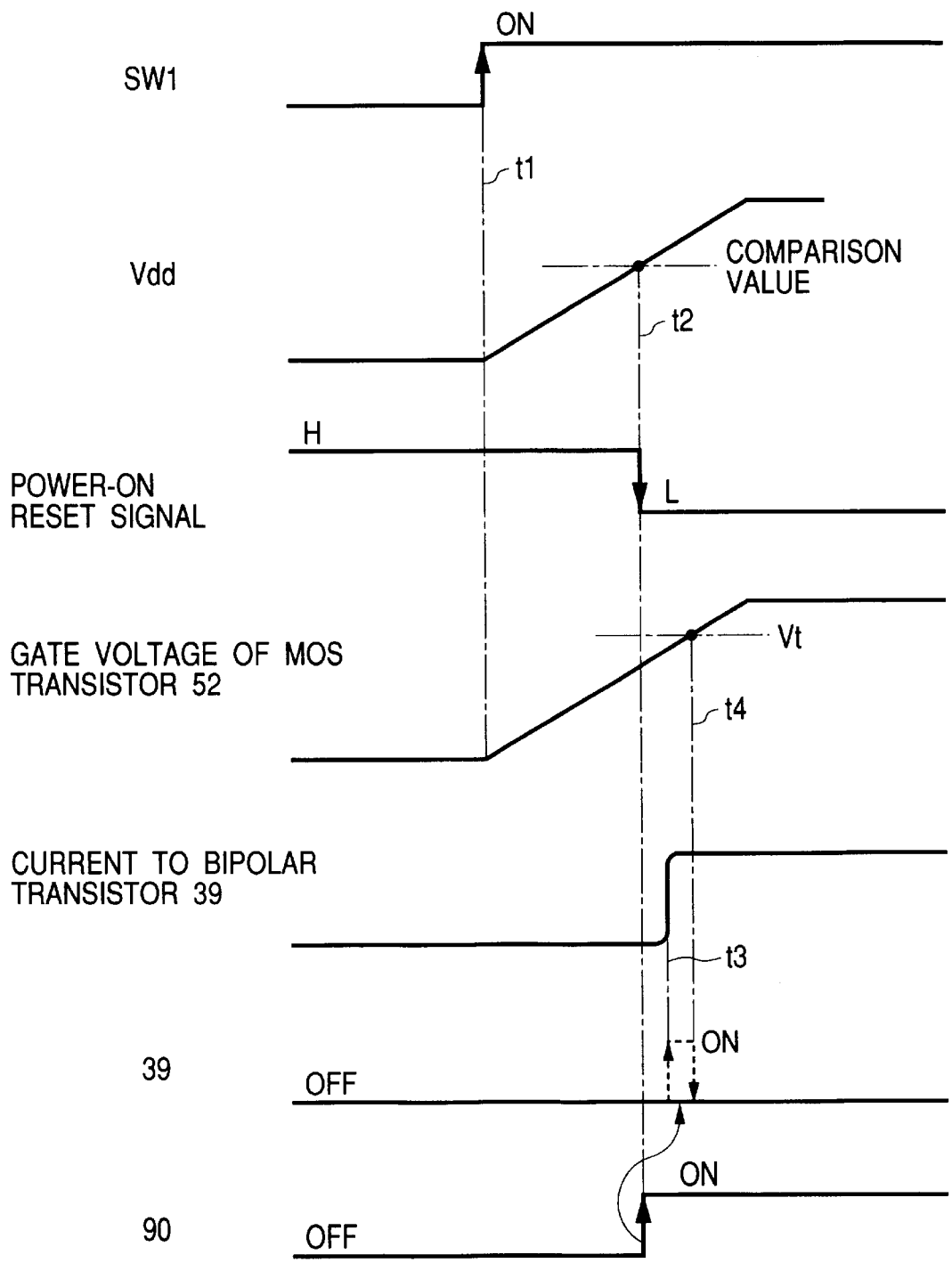
FIG. 5 is a timing chart useful for explaining an operation of the circuit arrangement according to the embodiment.

FIG. 5 is a timing chart showing a state of the power supply switch SW1 in FIG. 1, the drive signal Vdd and the power-on reset signal, the gate voltage of the MOS transistor 52 in FIG. 4, the supply (energizing) current to the base terminal of the bipolar transistor 39, the on/off states of the bipolar transistor 39, and the on/off states of the bipolar transistor 90 in FIG. 2.

In response to the input of the drive signal and the clock signal, in the level conversion CMOS logic circuit 50, the level of the drive signal is converted into a predetermined electric potential and is outputted as a drive signal for the bipolar analog circuit 30. Through the use of this signal, the power supply to the charge pump 20 is controlled in the bipolar analog circuit 30. Moreover, on the basis of the drive signal, the charge pump driving CMOS logic circuit 40, shown in FIG. 2, makes the charge pump conduct the boosting operation. The charge pump 20 is operated in this way to adjust the electric potential at the gate terminal of the power MOS transistor 3 (the boosted voltage is applied thereto) so that the power MOS transistor 3 is placed into the on-condition to energize (drive) the load 2. Accordingly, when the drive signal is in the non-inputted condition, the power MOS transistor 3 is in the off-condition.

On the other hand, when the power supply switch SW1 in FIG. 1 is placed into the on-condition at the timing of t1 in FIG. 5, the output voltage (drive voltage) Vdd of the constant-voltage circuit 6 increases gradually. When the drive voltage Vdd from the constant-voltage circuit 6 reaches a predetermined value (for example, 3 volts) (at the timing of t2 in FIG. 5), the output of the power-on reset circuit 7 turns to the L level.

The inverter 53 of the level conversion CMOS logic circuit 50 has a CMOS arrangement as shown in FIG. 4, and this inverter 53 receives the supply of the voltage Vdd from the constant-voltage circuit 6 to issue an output to gradually increase the gate voltage of the MOS transistor 52 as shown in FIG. 5. When the gate voltage of the MOS transistor 52 reaches a threshold voltage Vt (at the timing of t4 in FIG. 5), the MOS transistor 52 in FIG. 4 is placed into the on-condition to place the bipolar transistor 39 into the off-condition so that the bipolar transistor 51 turns to the off-condition to inhibit the power supply to the gate side of the power MOS transistor 3.

However, in the constant-current circuit 51 of the level conversion CMOS logic circuit 50, upon receipt of the supply of the voltage Vdd from the constant-voltage circuit 6, the energizing current to the base of the bipolar transistor 39 flows as shown in FIG. 5. Moreover, the bipolar transistor 39 in FIG. 4 tends to turn to the on-condition at the timing of t3 in FIG. 5 before the gate voltage of the MOS transistor 52 reaches the threshold voltage Vt. This occurs because of the unmatched state between the threshold voltage Vt of the MOS transistor 52 and the base-emitter voltage characteristic (Vbe characteristic) of the bipolar transistor 39. In response to the on-condition of the bipolar transistor 39, the bipolar transistor 31 is placed into the on-condition to cause the power supply to the gate side of the power MOS transistor 3. This increases the gate electric potential of the power MOS transistor 3 so that a difference in electric potential between the gate and source of the power MOS transistor 3 occurs through the resistor 86 shown in FIG. 2, thereby placing this transistor 3 into a half-on state. As a result, an unnecessary current flows through the load 2.

Thus, since the indeterminate state of the transistor 52 occurs in spite of stopping the supply of the drive signal to the inverter 53 with a CMOS arrangement, the high-side switch power MOS transistor 3 can fall into the on-condition so that a current flows in the load 2 to cause malfunctions in the used system. The occurrence of the malfunctions can lead to the activation of the diagnostic function to stop the system.

That is, although the drive signal is conveyed through the level conversion CMOS logic circuit 50 to the bipolar analog circuit 30 to turn on the power MOS transistor 3, the following situation arises when the power supply switch SW1 is placed into the on-condition (at power-on). In a case in which the activation (normal operation possible time) of the inverter 53 of the level conversion CMOS logic circuit 50 is later than the activation of the constant-current circuit 51, the electric potential at the gate terminal of the power MOS transistor 3 tends to rise due to the on-condition operation of the transistor 39 of the bipolar analog circuit 30 even in the case of no output of the drive signal. In a wide sense, in a case in which the transistor 39 of the bipolar analog circuit 30 operates in the on-condition before the level conversion CMOS logic circuit 50 exhibits its functions, there arises an increase in the gate voltage of the power MOS transistor 3 even in the case of no output of the drive signal. This causes the power MOS transistor 3 to fall into a half-on condition.

In this embodiment, an L-level signal from the power-on reset circuit 7 is inputted to the base terminal of the bipolar transistor 90 in FIG. 2 so that this transistor 90 is placed into the on-condition at the timing of t2 as shown in FIG. 5. Therefore, the base electric potential of the bipolar transistor 39 in FIG. 2 becomes the electric potential of the ground so that the transistors (39, 31) are switched into the off-condition. That is, in this semiconductor device (IC), the forcibly stopping bipolar transistor 90 is put into an integrated state, and this transistor 90 receives, at its base terminal, a signal which inverts when the drive voltage Vdd exceeds a predetermined value in accordance with the power-on and, hence, operates in the on-condition, thereby placing the bipolar analog circuit 30 into a driving-suspended state. In consequence, the rise of the electric potential at the gate terminal of the power MOS transistor 3 becomes avoidable, thereby maintaining the power MOS transistor 3 in the off-condition. That is, the bipolar transistor 39 is kept in the off-condition to prevent the power MOS transistor from falling into the half-on condition. In this way, in the composite IC in which integrated are the power MOS transistor 3, the bipolar analog circuit 30 and the CMOS logic circuits 40 and 50, it is possible to certainly place the power MOS transistor 3 into the off-condition at the time of power-on for suspending the driving of the load 2.

Thus, usually, in the case of a system using a logic circuit, a constant voltage (5 volts) is created in the system through the use of a battery (power supply) 1 to drive the logic circuit. For this reason, at power-on (at the time of activation), for the purpose of the logic circuit protection, the constant voltage (drive voltage) develops after the supply from the battery. At this time, the N-channel MOS transistor 52 does not function normally until it reaches the threshold voltage Vt of the transistor 52 for the charge pump driving. Therefore, a current is fed from the constant-current circuit 51, which functions earlier than the timing of reaching the threshold voltage Vt of the N-channel MOS transistor 52, to the base terminal of the NPN transistor 39. Moreover, in the bipolar analog circuit 30, the voltage at the base terminal of the bipolar transistor 39 rises so that the bipolar transistor 39 is placed into the on-condition (the charge pump 20 is placed into the driven state). In this case, since the clock operation does not take place, the boosting operation is not conducted. However, due to the on-condition of the aforesaid transistor 39, the power supply voltage VB is applied through the charge pump 20 to the gate terminal of the high-side switch power MOS transistor 3. Therefore, a current flows through the off-condition resistor 86 between the gate and source of the power MOS transistor 3 and, as a result, a voltage is applied between the gate and source thereof (the gate voltage rises), thereby producing the half-on state in which the power MOS transistor 3 falls slightly into the on-condition. Thus, in the level conversion CMOS logic circuit 50, there is a possibility that a desired output state is not taken due to the unmatched condition between the threshold voltage Vt of the MOS transistor 52 and the base-emitter voltage characteristic (Vbe characteristic) of the transistor 39 in the bipolar analog circuit 30.

In this connection, according to embodiment, the NPN transistor 90 is provided to surely place the bipolar transistor 39 into the off-condition even in the above-mentioned situation, and the NPN transistor 90 is placed into the on-condition by a signal from the power-on reset circuit 7. Accordingly, even if the N-channel MOS transistor 52 is in an indeterminate state, the NPN transistor 90 is maintainable in the on-condition to surely place the NPN transistor 39 (and the transistor 31) into the off-condition. That is, as a signal for driving the transistor 90, in the case of a usual BiCMOS IC, a power-on reset signal is used which is for settling the initial state of the CMOS, and since this signal inverts when exceeding the power-on reset voltage, this signal is used as the base signal for the transistor 90.

In addition to the above-mentioned arrangement, the following arrangement is also feasible.

As the power transistor, in addition to a MOSFET, an IGBT or bipolar transistor is also acceptable.

Moreover, in the above-description, although the gate driving circuit using the charge pump has been employed as a circuit for turning on/off the power transistor, the present invention is also applicable to a circuit arrangement which does not include a charge pump. That is, in this circuit arrangement, in FIG. 2, the charge pump 20 and the charge pump driving CMOS logic circuit 40 are not put to use, and the bipolar analog circuit 30 and the level conversion CMOS logic circuit 50 are integrated with each other. In this case, in the level conversion CMOS logic circuit 50, the level of a drive signal is converted into a predetermined electric potential and it is outputted as a drive signal for the bipolar analog circuit 30. In the bipolar analog circuit 30, this signal adjusts the electric potential at the control terminal of the power MOS transistor 3, and the power MOS transistor 3 is placed into the on-condition to energize the load. Also in the case of the employment of such a circuit arrangement, the forcibly stopping bipolar transistor 90 surely places the power transistor into the off-condition at the power-on to suspend the driving of the load.

Still moreover, although the power transistor has been used a high-side switch, it is also possible that it is used as a low-side switch.

Yet moreover, in the above description, although the power supply to the semiconductor device (IC) is made through the on-condition operation of the power supply switch SW1 (power-on operation), it is possible to prevent the malfunctions stemming from the half-on of a power element also in the case of restoration from a drop of the power supply voltage or in the case of instantaneous disconnection from the power supply voltage. The point is that the above-described arrangement is useful when the power supply is made to the semiconductor device (IC).

It should be understood that the present invention is not limited to the above-described embodiment, and that it is intended to cover all changes and modifications of the embodiment of the invention herein which do not constitute departures from the spirit and scope of the invention.

What is claimed is:

1. A load-driving semiconductor device comprising:
   a power transistor connected in series to a load between a power supply and ground;
   a bipolar analog circuit connected between said power supply and a control terminal of said power transistor for adjusting an electric potential at said control terminal of said power transistor;
   a level conversion MOS logic circuit for receiving a drive signal to convert a signal level of said drive signal into a predetermined electric potential for outputting the converted signal level as an input drive signal for said bipolar analog circuit; and
   a forcibly stopping bipolar transistor for receiving, at its base terminal, a signal to turn on said forcibly stopping bipolar transistor when a drive voltage exceeds a predetermined value in response to power-on, thereby placing said bipolar analog circuit into a driving-stopped condition.

2. A load-driving semiconductor device comprising:
   a power transistor connected in series to a load between a power supply and ground;
   a charge pump connected to a control terminal of said power transistor for adjusting an electric potential at said control terminal of said power transistor;
   a bipolar analog circuit connected between said power supply and said charge pump for controlling a supply voltage to said charge pump on the basis of a drive signal;
   a charge pump driving MOS logic circuit for, on the basis of the drive signal, enabling said charge pump conduct a boosting operation;
   a level conversion MOS logic circuit for receiving the drive signal to convert a signal level of said drive signal into a predetermined electric potential for outputting the converted signal level as an input drive signal for said bipolar analog circuit; and
   a forcibly stopping bipolar transistor for receiving, at its base terminal, a signal to turn on said forcibly stopping bipolar transistor when a drive voltage exceeds a predetermined value in response to power-on, thereby placing said bipolar analog circuit into a driving-stopped condition.

3. A load-driving semiconductor device comprising:
   a high-side switch power transistor connected in series to a load between a power supply and ground, said high-side switch power transistor is connected in between the power supply and the load;
   a charge pump connected to a control terminal of said power transistor for adjusting an electric potential at said control terminal of said power transistor;
   a bipolar analog circuit connected between said power supply and said charge pump for controlling a supply voltage to said charge pump on the basis of a drive signal;
   a charge pump driving MOS logic circuit for, on the basis of the drive signal, enabling said charge pump conduct a boosting operation;
   a level conversion MOS logic circuit for receiving the drive signal to convert a signal level of said drive signal into a predetermined electric potential for outputting the converted signal level as an input drive signal for said bipolar analog circuit; and
   a forcibly stopping bipolar transistor for receiving, at its base terminal, a signal to turn on said forcibly stopping bipolar transistor when a drive voltage exceeds a predetermined value in response to power-on, thereby placing said bipolar analog circuit into a driving-stopped condition.

4. The device according to claim 1, wherein said level conversion MOS logic circuit includes:
   a constant-current circuit;
   a MOS transistor connected in series to said constant-current circuit for outputting said input drive signal for said bipolar analog circuit with a predetermined electric potential by conducting an on/off operation; and
   an inverter having an input for receiving said drive signal and having an output connected to a gate terminal of said MOS transistor.

5. The device according to claim 2, wherein said level conversion MOS logic circuit includes:

a constant-current circuit;

a MOS transistor connected in series to said constant-current circuit for outputting said input drive signal for said bipolar analog circuit with a predetermined electric potential by conducting an on/off operation; and an inverter having an input for receiving said drive signal and having an output connected to a gate terminal of said MOS transistor.

6. The device according to claim 3, wherein said level conversion MOS logic circuit includes:

a constant-current circuit;

a MOS transistor connected in series to said constant-current circuit for outputting said input drive signal for said bipolar analog circuit with a predetermined electric potential by conducting an on/off operation; and an inverter having an input for receiving said drive signal and having an output connected to a gate terminal of said MOS transistor.

7. The device according to claim 4, wherein said inverter is a CMOS inverter.

8. The device according to claim 5, wherein said inverter is a CMOS inverter.

9. The device according to claim 6, wherein said inverter is a CMOS inverter.

10. The device according to claim 1, wherein said power transistor is one of a MOSFET and an IGBT.

11. The device according to claim 2, wherein said power transistor is one of a MOSFET and an IGBT.

12. The device according to claim 3, wherein said power transistor is one of a MOSFET and an IGBT.

* * * * *